(12) United States Patent
Fang et al.

(10) Patent No.: US 11,075,228 B2
(45) Date of Patent: Jul. 27, 2021

(54) DISPLAY SUBSTRATE, METHOD FOR MANUFACTURING THE SAME, AND DISPLAY DEVICE

(71) Applicant: BOE Technology Group Co., Ltd., Beijing (CN)

(72) Inventors: Jingang Fang, Beijing (CN); Luke Ding, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/599,948

(22) Filed: Oct. 11, 2019

(65) Prior Publication Data
US 2020/0119054 A1 Apr. 16, 2020

(30) Foreign Application Priority Data
Oct. 15, 2018 (CN) .......................... 201811196955.3

(51) Int. Cl.
*H01L 27/12* (2006.01)
*H01L 29/786* (2006.01)

(52) U.S. Cl.
CPC ...... *H01L 27/1244* (2013.01); *H01L 27/1225* (2013.01); *H01L 27/1248* (2013.01); *H01L 27/1255* (2013.01); *H01L 27/1259* (2013.01); *H01L 29/78633* (2013.01); *H01L 29/78693* (2013.01)

(58) Field of Classification Search
CPC ............. H01L 27/1244; H01L 27/1225; H01L 27/1248; H01L 27/1255; H01L 27/1259; H01L 27/1218; H01L 29/78633; H01L 29/78693; H01L 29/78603

USPC ................. 257/43, 59, 72, 79, 99, E27.026, 257/E27.071, E27.073, E33.053, E33.055, 257/E21.532, E21.535, E21.606, E21.614;
(Continued)

(56) References Cited

U.S. PATENT DOCUMENTS 5,751,012 A * 5/1998 Wolstenholme .... H01L 27/1021
257/2
2002/0057594 A1* 5/2002 Hirai ....................... G11C 11/15
365/171
(Continued)

FOREIGN PATENT DOCUMENTS

| CN | 105575961 A | 5/2016 |
|---|---|---|
| CN | 107170749 A | 9/2017 |
| CN | 108198825 A | 6/2018 |

OTHER PUBLICATIONS

First Office Action dated Mar. 20, 2020, for corresponding Chinese application 201811196955.3.

*Primary Examiner* — Dao H Nguyen
(74) *Attorney, Agent, or Firm* — Nath, Goldberg & Meyer; Joshua B. Goldberg

(57) ABSTRACT

A display substrate, a method for manufacturing the display substrate, and a display device are provided in the present disclosure. The display substrate includes: a substrate; a first insulation layer on the substrate; a first signal line on a side of the first insulation layer distal to the substrate; a second insulation layer covering the first signal line; and a second signal line on a side of the second insulation layer distal to the substrate, the second signal line overlapping with the first signal line at an overlap region. A concave portion is formed in the first insulation layer. At least at the overlap region, the first signal line is in the concave portion.

18 Claims, 5 Drawing Sheets

(58) Field of Classification Search
USPC ....... 313/511, 582; 349/43, 44, 47; 438/129, 438/104
See application file for complete search history.

(56) References Cited

U.S. PATENT DOCUMENTS

| | | | |
|---|---|---|---|
| 2003/0193056 A1* | 10/2003 | Takayama | H01L 27/124 257/79 |
| 2006/0166434 A1* | 7/2006 | Kinoshita | H01L 23/522 438/253 |
| 2016/0178953 A1 | 6/2016 | Ye | |
| 2017/0271368 A1 | 9/2017 | Zhang et al. | |

* cited by examiner

DISPLAY SUBSTRATE, METHOD FOR MANUFACTURING THE SAME, AND DISPLAY DEVICE

CROSS-REFERENCE TO RELATED APPLICATIONS

The present disclosure claims the priority of Chinese Patent Application No. 201811196955.3, filed on Oct. 15, 2018, the contents of which are incorporated herein by reference in its entirety.

TECHNICAL FIELD

The present application relates to the field of display technology, in particular, to a display substrate, a method for manufacturing the display substrate, and a display device.

BACKGROUND

In the field of display technology, AMOLED displayers have become a focus of current research due to advantages such as quick response speed, wide color gamut, high contrast ratio, wide viewing angle, ultra-thin thickness, and low power consumption.

SUMMARY

According to an aspect of the disclosure, a display substrate is provided. The display substrate may include: a substrate; a first insulation layer, on the substrate; a first signal line, on a side of the first insulation layer distal to the substrate; a second insulation layer, covering the first signal line; and a second signal line, on a side of the second insulation layer distal to the substrate, the second signal line overlapping with the first signal line at an overlap region. A concave portion is formed in the first insulation layer. At least at the overlap region, the first signal line is in the concave portion.

In an embodiment, an extension direction of the first signal line intersects with an extension direction of the second signal line.

In an embodiment, the concave portion has a hole shape; and a portion of the first signal line is in the hole-shaped concave portion in the overlap region.

In an embodiment, the concave portion is a long groove extending in parallel to a surface of the substrate; and the first signal line is in the long groove.

In an embodiment, a surface, which is distal to the side of the substrate, of the first signal line in the concave portion protrudes from the concave portion.

In an embodiment, a surface, which is distal to the side of the substrate, of the first signal line in the concave portion is flush with an opening of the concave portion.

In an embodiment, a surface, which is distal to the side of the substrate, of the first signal line in the concave portion is lower than an opening of the concave portion.

In an embodiment, the first insulation layer comprises silicon organic glass.

In an embodiment, the display substrate further includes a third insulation layer between a bottom surface of the concave portion and the first signal line.

In an embodiment, the display substrate further includes a third insulation layer covering the bottom surface and sidewalls of the concave portion and extending onto a surface of the first insulation layer distal to the substrate.

In an embodiment, the display substrate further includes: a metal light-shielding layer, on a side of the substrate proximal to the first insulation layer and covered by the first insulation layer; and a thin film transistor, on the side of the first insulation layer distal to the substrate. An orthographic projection of the thin film transistor on the metal light-shielding layer is inside the metal light-shielding layer.

According to an aspect of the disclosure, a method for manufacturing a display substrate is provided. The method may include: forming a first insulation layer on a substrate; forming a concave portion in the first insulation layer; forming a first signal line on a side of the first insulation layer distal to the substrate; forming a second insulation layer on the first signal line; and forming a second signal line on a side of the second insulation layer distal to the substrate. The second signal line overlaps with the first signal line at an overlap region. At least at the overlap region, the first signal line is formed in the concave portion.

In an embodiment, the forming a first insulation layer on the substrate and forming a concave portion in the first insulation layer may include: coating a solution of silicon organic glass on the substrate; and performing a pre-baking process, an exposure process, and a development process on the solution of silicon organic glass to obtain the concave portion.

In an embodiment, an extension direction of the first signal line intersects with an extension direction of the second signal line. The concave portion is formed in a hole shape. A portion of the first signal line is formed in the hole-shaped concave portion in the overlap region.

In an embodiment, an extension direction of the first signal line intersects with an extension direction of the second signal line. The concave portion is formed as a long groove extending in parallel to a surface of the substrate. The first signal line is formed in the long groove.

In an embodiment, the first signal line is formed such that a surface, which is distal to the side of the substrate, of the first signal line in the concave portion is flush with an opening of the concave portion.

In an embodiment, the first signal line is formed such that a surface, which is distal to the side of the substrate, of the first signal line in the concave portion protrudes from the concave portion.

In an embodiment, between the forming a concave portion in the first insulation layer and the forming a second insulation layer, the method may further include:

forming a third insulation layer covering the bottom surface and sidewalls of the concave portion and extending onto a surface of the first insulation layer distal to the substrate; and forming the first signal line on the third insulation layer in the concave portion.

In an embodiment, between the forming a concave portion in the first insulation layer and the forming a second insulation layer, the method may further include: forming a third insulation layer on a bottom surface of the concave portion; and forming the first signal line on the third insulation layer.

According to an aspect of the disclosure, a display device including the above display substrate is provided.

DETAILED DESCRIPTION

In order to enable those skilled in the art to better understand the technical solutions of the present disclosure, the present disclosure will be further described in detail below in conjunction with the accompanying drawings and specific embodiments.

In the disclosure, two structures are arranged in a same layer, which means that the two structures are formed of the same material, and the two structures are arranged in the same layer in view of the stack relationship of layers, but neither means that the distances of the two structures from the substrate are equal to each other, nor means that one or more layers between the one structure and the substrate are identical in structure to one or more layers between another structure and the substrate.

In the disclosure, the "patterning process" refers to a process for forming a structure having a specific pattern. The patterning process may include a photolithography process, such as one or more steps for forming a material layer, a step for coating photoresist, an exposure step, a development step, an etching step, and a step for removing the photoresist; of course, the "patterning process" may also be an imprint process, an inkjet printing process, or the like.

According to a display substrate in related art (for example, a liquid crystal display substrate or an OLED display substrate), in order to supply power to pixels, gate lines and data lines, that are intersected with each other, are provided in the display substrate. In order to prevent the gate lines from being electrically coupled with the data lines, an insulation layer is provided between the gate lines and the data lines.

An area of the cross-section of the gate line is required to be sufficiently large for reducing the resistance of the gate line. However, since the gate line has a limited width, it is required to increase the thickness of the gate line, which results in the fact that the gate line has high and steep sidewalls. When the gate line is below the data line, the insulation layer at the sidewalls of the gate line becomes relatively thin, and the data line at the sidewalls of the gate line becomes relatively thin as well. The thinner insulation layer tends to cause poor electrostatic discharge (ESD), and the thinner data line tends to cause wire breakage.

The present embodiment provides a display substrate including a substrate 10, a first insulation layer 20 disposed on the substrate 10, a first signal line 31 disposed on a side of the first insulation layer 20 distal to the substrate 10, a second insulation layer 40 covering the first signal line 31, and a second signal line 32 disposed on a side of the second insulation layer 40 distal to the substrate 10. The first signal line 31 overlaps with the second signal line 32 at an overlap region.

Figure 1:
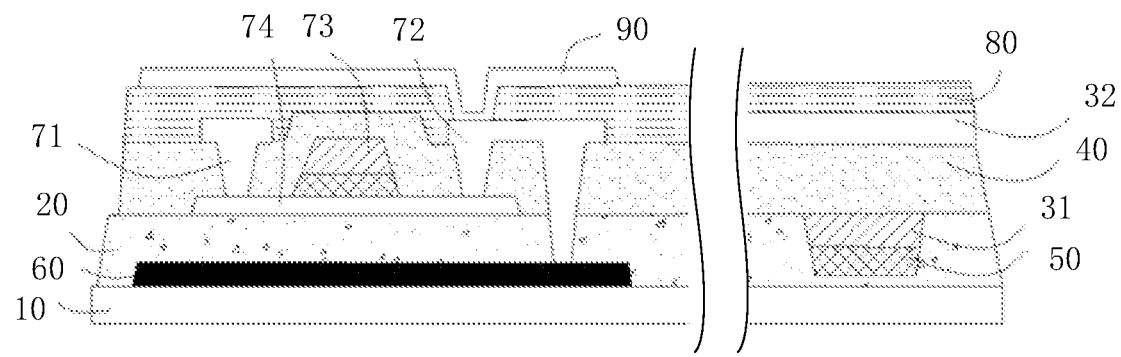
FIG. 1 is a diagram showing a cross-section of a display substrate according to an embodiment of the present disclosure.
Figure 2:
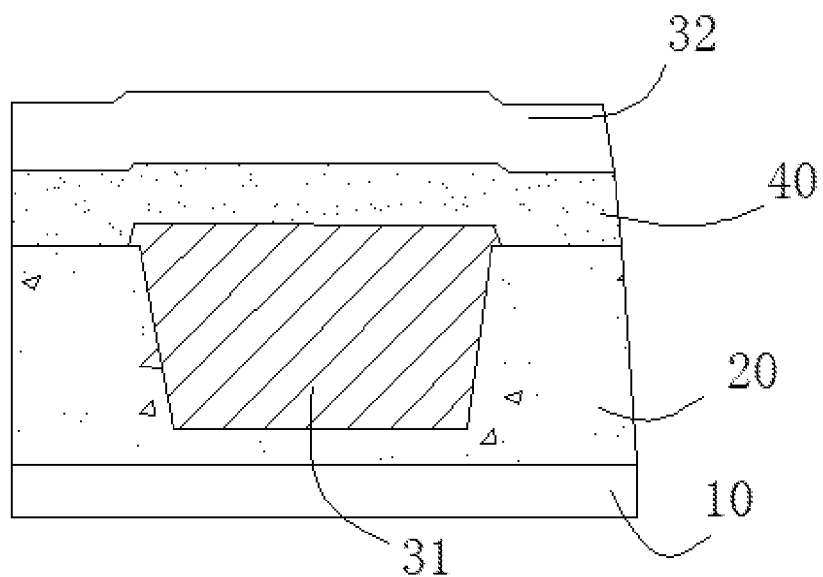
FIG. 2 is a diagram showing a cross-section of a display substrate taken along a line AA in FIG. 1 according to an embodiment of the present disclosure.

As shown in FIGS. 1 and 2, the first signal line 31 and the second signal line 32 are separated apart from each other by the second insulation layer 40. The first signal line 31 and the second signal line 32 each have the overlap region.

A concave portion is provided in the first insulation layer 20. At least at the overlap region, the first signal line 31 is in the concave portion.

In an embodiment, at least a portion of side surfaces of the first signal line 31 within the concave portion are in contact with the sidewalls of the concave portion.

Figure 4:
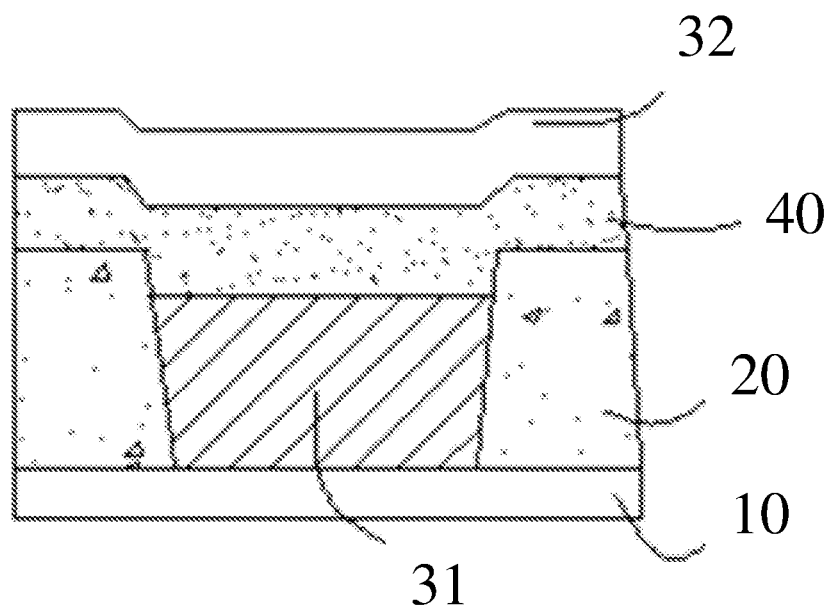
FIG. 4 is a diagram showing a cross-section of a display substrate taken along the line AA in FIG. 1 according to an embodiment of the present disclosure.

That is, at least a portion of the first signal line 31 is disposed in the concave portion, and the first signal line 31 has the same width as that of the concave portion, such that the at least a portion of the side surfaces of the first signal line 31 are in contact with the sidewalls of the concave portion without a gap therebetween. Since both the concave portion and the first signal line 31 have a slope angle in the actual product, a part of each side surface of the first signal line 31 within the concave portion may be not in contact with the sidewalls of the concave portion. Therefore, a height of the side surfaces of the first signal line 31 protruding from the first insulation layer 20 is reduced (as shown in FIG. 2); alternatively, the first signal line 31 within the concave portion does not exceed out of the first insulation layer 20 at all and is flush with the first insulation layer 20, as shown in FIG. 1. Of course, the first signal line 31 may also be completely inside the concave portion, that is, an upper surface of the first signal line 31 may be lower than an opening of the concave portion, as shown in FIG. 4. In either case, it is also possible to realize a reduced slope of the sidewalls of the second insulation layer 40 above the first signal line 31 and a reduced slope of the sidewalls of the second signal line 32, thereby avoiding the poor ESD due to the thin sidewalls of the second insulation layer 40 and the wire breakage due to the thin sidewalls of the second signal line 32.

In an embodiment, the side surfaces of the first signal line 31 within the concave portion are not in contact with the sidewalls of the concave portion. That is, in a patterning process for forming a pattern of the first signal line 31, a width of the first signal line 31 in the concave portion is set to be narrower than a width of the bottom surface of the concave portion, such that the sidewalls of the first signal line 31 in the concave portion are not in contact with the sidewalls of the concave portion. According to this embodiment, it is also possible to realize the reduced slope of the sidewalls of the second insulation layer 40 above the first signal line 31 and the reduced slope of the sidewalls of the second signal line 32, thereby avoiding the poor ESD due to the thin sidewalls of the second insulation layer 40 and the wire breakage due to the thin sidewalls of the second signal line 32.

In an embodiment, a surface, which is distal to the side of the substrate 10, of the first signal line 31 in the concave portion is flush with an opening of the concave portion, as shown in FIG. 1.

In this embodiment, an upper surface of the first signal line 31 in the concave portion is just flush or aligned with the opening of the concave portion, such that at the concave portion, both of the bottom surface of the second insulation layer 40 above the first signal line 31 and the bottom surface of the second signal line 32 are flat surfaces without any slope, thereby further reducing poor ESD and wire breakage.

Figure 3:
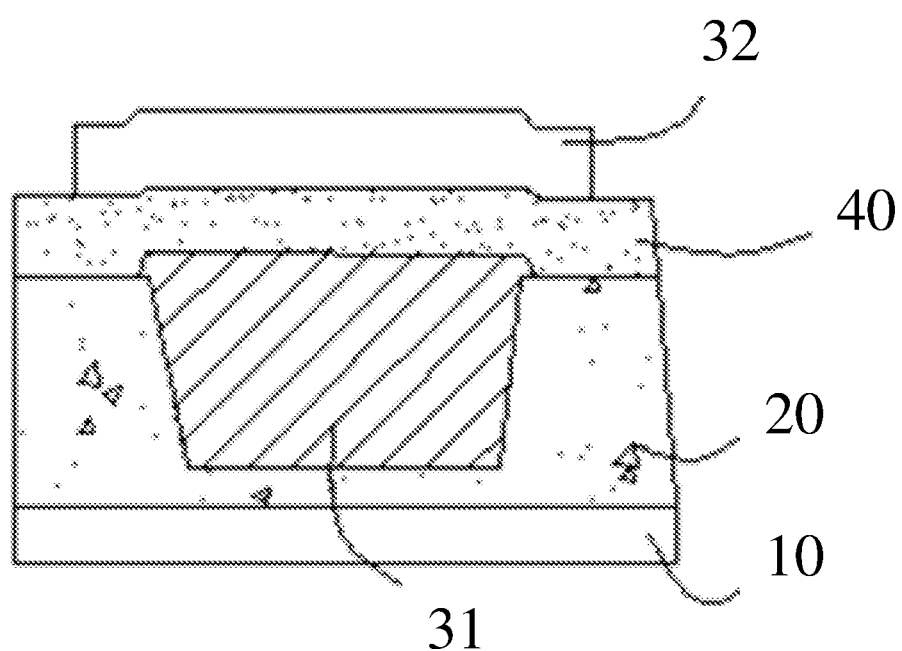
FIG. 3 is a diagram showing a cross-section of a display substrate taken along the line AA in FIG. 1 according to an embodiment of the present disclosure.

In an embodiment, as shown in FIGS. 2 and 3, the upper surface of the first signal line 31 in the concave portion exceeds, protrudes from, or is higher than the opening of the concave portion. Alternatively, as shown in FIG. 4, the upper surface of the first signal line 31 in the concave portion is entirely in the concave portion or is completely below or lower than the opening of the concave portion.

In either case, the slope of the sidewalls of the second signal line 32 can be reduced.

Specifically, as shown in FIGS. 1 to 3, the bottom surface of the above-mentioned concave portion may be inside the first insulation layer 20, or the concave portion may penetrate through a portion of the first insulation layer 20 in a vertical direction perpendicular to the substrate 10. In other words, the concave portion is not a through-hole. Alternatively, as shown in FIG. 4, the concave portion may completely penetrate through the first insulation layer 20 in the vertical direction and reach the substrate 10. In other words, the concave portion may also be a through-hole.

In case where the concave portion is a through-hole, the first signal line 31 is entirely in the concave portion. That is, a height of the first signal line 31 in the concave portion is the same as a height of the first insulation layer 20. Therefore, a slope may not be formed at a location, which corresponds to the first signal line 31, of the bottom surface of the second insulation layer 40 under which the first signal line 31 is located.

In an embodiment, an extension direction of the first signal line 31 intersects with an extension direction of the second signal line 32.

Figure 5:
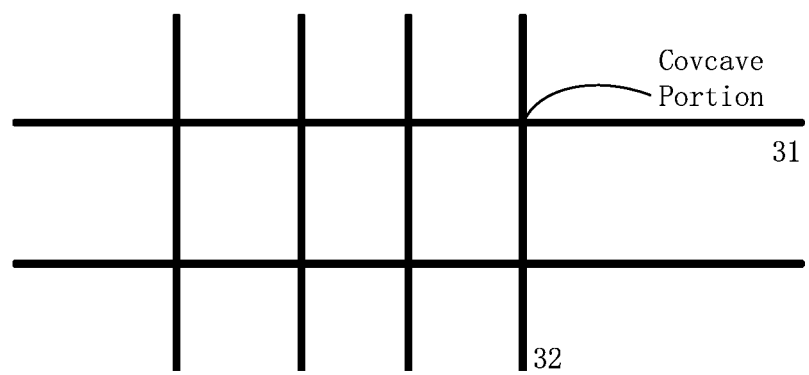
FIG. 5 is a plan view showing a display substrate according to an embodiment of the present disclosure.
Figure 6:
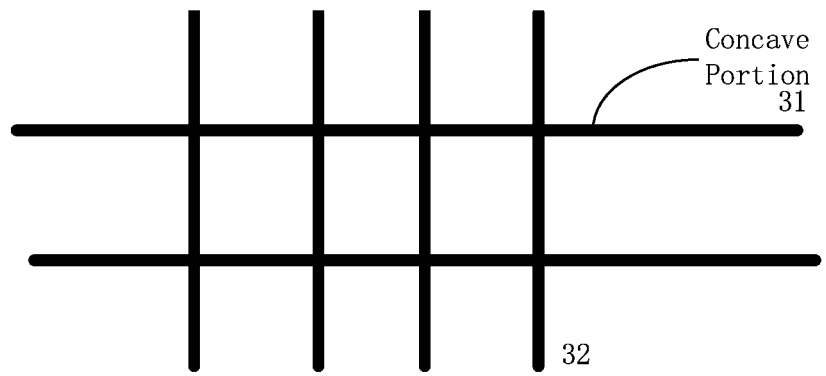
FIG. 6 is a plan view showing a display substrate according to an embodiment of the present disclosure.

Generally, the extension directions of the first signal line 31 and the second signal line 32, that are located in different layers, intersect with each other (for example, as shown in FIGS. 1 and 2, the first signal line 31 may extend in a direction perpendicular to the direction that the second signal line 32 may extend, as shown in FIGS. 5 and 6), and the first signal line 31 and the second signal line 32 may overlap at the overlap region.

As shown in FIG. 3, both the second signal line 32 and the first signal line 31 extend in the same direction. However, the second signal line 32 is wider than the first signal line 31, and the second signal line 32 overlaps with the first signal line 31 at the overlap region.

Generally, the extension direction of the first signal line 31 is perpendicular to the extension direction of the second signal line 32. Further, the first signal line 31 is perpendicular to the second signal line 32.

In an embodiment, the concave portion has a hole shape (e.g., a round hole, a square hole, etc.) and is only located in the overlap region. The concave portion extends from the surface of the first insulation layer 20 distal to the substrate 10 to the inside of the first insulation layer 20 in a direction perpendicular to the substrate 10. No concave portion is provided in the region outside the overlap region, as shown in FIG. 5. The first signal line 31 may be located in the hole-shaped concave portion only at the overlap region. This configuration of the concave portion has a technical effect such as simplified manufacture process.

In another embodiment, the concave portion is a long groove that extends in parallel to the surface of the substrate 10. The concave portion is located not only in the overlap region but also in the region outside the overlap region. That is, in the plan view as shown in FIG. 6, the long groove may be perpendicular to the second signal line 32. The first signal line 31 may entirely be in the long groove.

In an embodiment, the first insulation layer 20 is made of silicon organic glass.

The first insulation layer 20 is formed of a solution of silicon organic glass (SOC). Since the solution of silicon organic glass has a high fluidity, a flat layer can be easily formed. Due to the natural property of the solution of silicon organic glass, the patterning process on the silicon organic glass can be performed after a pre-baking process, an exposure process, a development process, and a post-baking process are performed on the silicon organic glass, such that the appearance of the silicon organic glass can be obtained without performing an etching process, thereby facilitating the simplified manufacture process.

In an embodiment, as shown in FIG. 1, the display substrate further includes a third insulation layer 50 between the bottom surface of the concave portion and the first signal line 31.

That is, the third insulation layer 50 is first formed in the concave portion, and then a first signal line 31 is disposed on the third insulation layer 50. On one hand, the third insulation layer 50 may enhance the insulating effect of the bottom surface of the concave portion; on the other hand, the third insulation layer 50 may adjust the height of the first signal line 31 in the concave portion.

Figure 7:
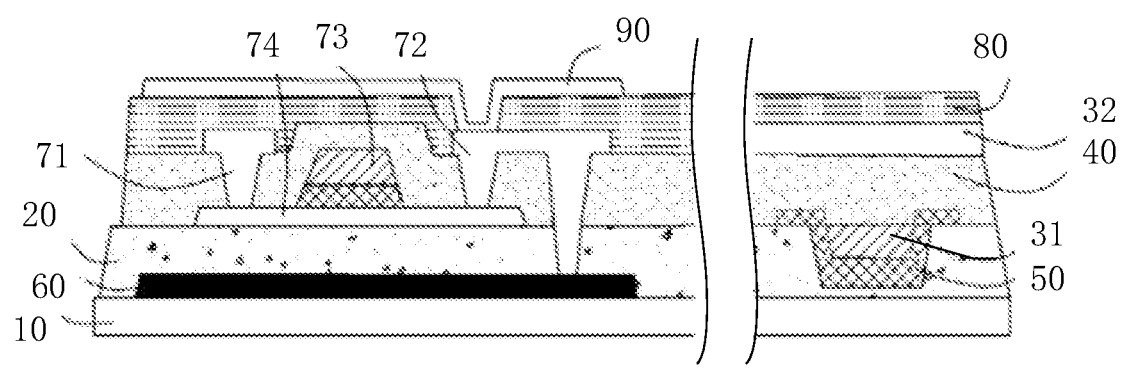
FIG. 7 is a diagram showing a cross-section of a display substrate according to an embodiment of the present disclosure.

In an embodiment, the third insulation layer 50 may cover the bottom surface and sidewalls of the concave portion and extend to the surface of the first insulation layer 20 distal to the substrate 10, as shown in FIG. 7. This configuration of the third insulation layer 50 has a technical effect such as less steps and high yield.

In another embodiment, the third insulation layer 50 may cover only the bottom surface of the concave portion, as shown in FIG. 1. This configuration of the third insulation layer 50 has a technical effect such as simplified manufacture process.

The first signal line 31 includes a gate line, and the second signal line 32 includes a data line.

Specifically, the first signal line 31 in FIG. 1 is a gate line (which can be disposed in the same layer as the gate electrode 73), and the second signal line 32 in FIG. 1 is a data line (which can be disposed in the same layer as the drain electrode 71 and source electrode 72). The third insulation layer 50 in FIG. 1 is separated from the gate insulation layer between the gate electrode 73 and the active region 74, and the gate insulation layer is located in a device region of the thin film transistor and between the gate electrode 73 and the active region 74.

As shown in FIG. 1, the display substrate further includes a metal light-shielding layer 60 disposed on a side of the substrate 10 proximal to the first insulation layer 20. The first insulation layer 20 covers the metal light-shielding layer 60. The display substrate is further provided with a thin film transistor. The thin film transistor is disposed on a side of the first insulation layer 20 distal to the substrate 10, and an orthographic projection of the thin film transistor on a plane where the metal light-shielding layer 60 is located is inside the metal light-shielding layer 60.

The metal light-shielding layer 60 is disposed under the device region of the thin film transistor, thereby avoiding the influence of illumination on the thin film transistor. The metal light-shielding layer 60 may be coupled to the source electrode 72 through a via-hole (as shown in FIG. 1) to form one electrode of a storage capacitor, and the other electrode of the storage capacitor is coupled to the gate electrode 73. Of course, the metal light-shielding layer 60 can also be coupled to the gate electrode 73 through a via-hole to form one electrode of the storage capacitor, and the other electrode of the storage capacitor can be coupled to a signal source providing a constant voltage (e.g., a power source).

In this embodiment, the first insulation layer 20 also serves as a planarization layer.

A method for manufacturing a display substrate is provided in an embodiment. The display substrate is the display substrate according to the above embodiments, and the method includes the following steps:

First, a first insulation layer 20 is formed on a substrate 10 through a patterning process, and a concave portion is formed in the first insulation layer 20.

Second, a first signal line 31 is formed on the first insulation layer 20 through a patterning process.

And then, a second insulation layer 40 is formed on the first signal line 31. The second insulation layer 40 covers the entire substrate 10.

At last, a second signal line 32 is formed on the second insulation layer 40 through a patterning process.

That is, the first insulation layer 20, the first signal line 31, the second insulation layer 40, and the second signal line 32 are sequentially formed on the substrate 10.

When the first insulation layer 20 is formed of a solution of silicon organic glass, the forming a first insulation layer 20 on a substrate 10 through a patterning process, and forming a concave portion in the first insulation layer 20 includes the following steps:

First, a solution of silicon organic glass is coated on the substrate 10.

And then, a pre-baking process, an exposure process, and a development process are performed on the solution of silicon organic glass to obtain the concave portion.

Due to the natural property of the solution of silicon organic glass, the patterning process on the silicon organic glass can be performed after the pre-baking process, the exposure process, and the development process are performed on the silicon organic glass, such that the appearance of the silicon organic glass can be obtained without performing an etching process, thereby facilitating the simplified manufacture process. Further, a post-baking process is performed on the obtained concave portion so as to stabilize the structure of the concave portion.

When the display substrate has the third insulation layer 50, between the forming a concave portion in the first insulation layer 20 and the forming a second insulation layer 40, the method further includes the following steps:

First the third insulation layer 50 is formed in the concave portion of the first insulation layer 20 through a patterning process; and then a first signal line 31 is formed on the third insulation layer 50.

For example, the third insulation layer 50 covers only the bottom surface of the concave portion, and is between the bottom surface of the concave portion and the first signal line 31, as shown in FIG. 1. This configuration of the third insulation layer 50 has a technical effect such as a simplified manufacture process.

For another example, the third insulation layer 50 may cover the bottom and sidewalls of the concave portion and extend onto a surface of the first insulation layer 20 distal to the substrate 10. This configuration of the third insulation layer 50 has a technical effect such as less steps and high yield.

Figure 8:
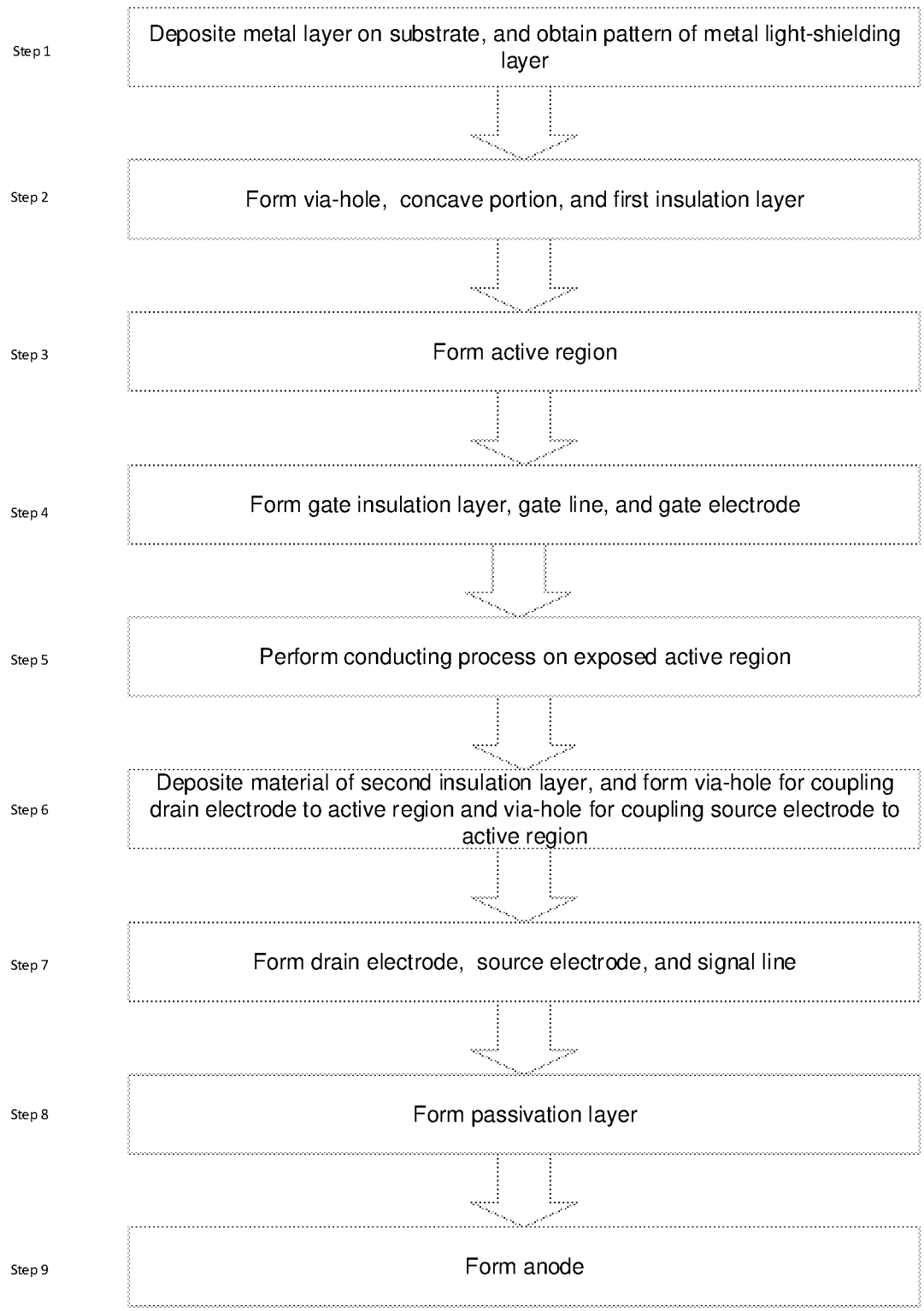
FIG. 8 is a flowchart showing a method for manufacturing a display substrate according to an embodiment of the present disclosure.

As shown in FIG. 8, the following steps 1 to 9 are process steps for manufacturing the display substrate shown in FIG. 1.

At step 1, a substrate 10 is provided. For example, the substrate 10 is formed of a transparent material (for example, quartz glass) with a thickness of 50 um-1000 um. A metal layer (such as Al or Cu) is deposited on the substrate 10 using a sputtering device, and a pattern of the metal light-shielding layer 60 is obtained through a patterning process.

At step 2, a solution of silicon organic glass is coated by spin coating. The pre-baking process, the exposure process, and the development process are performed on the silicon organic glass to form a via-hole for coupling the source electrode 72 to the metal light-shielding layer 60 and the concave portion for accommodating the first signal line 31. Thereafter, the resulted product is post-baked at a temperature of about 230 degrees to obtain dense silicon oxide (i.e., the first insulation layer 20) with a thickness in a range of 300 nm-500 nm. Further, the first insulation layer 20 also facilitates to alleviate a height of the metal light-shielding layer 60. If a depth of the via-hole for coupling the source electrode 72 to the metal light-shielding layer 60 is different from a depth of the concave portion for accommodating the first signal line 31, the exposure degree of the via-hole should be different from the exposure degree of the concave portion (for example, exposure process using a grayscale mask). However, development process can be performed on the via-hole and the concave portion together.

At step 3, an oxide material, as a material of an active region 74, is deposited on the first insulation layer 20 by using a sputtering device, and then a photolithography process, a wet-etching process, and photoresist removal process, and the like are performed on the material of the active region 74 to obtain an active region 74. The active region 74 may include an amorphous oxide such as IGZO, ZnON or ITZO.

At step 4, a material of a third insulation layer 50 and a gate insulation layer (referred to as a GI layer) is deposited through chemical vapor deposition (CVD) process; and then a gate metal layer is deposited using the sputtering device for forming a gate electrode 073 and a gate line (i.e., the first signal line 31). The gate metal layer has a thickness in a range of 200 nm-1000 nm and includes a material such as Al, Mo, Cr, Cu, Ti, and the like. The photolithography process and the wet-etching process are performed on the gate metal layer so as to obtain a pattern of the gate electrode 73 and a pattern of the gate line. The photoresist is maintained and not removed, and a dry-etching process is continuously performed on the material of the gate insulation layer using the photoresist above the gate metal layer as a mask, so as to obtain a pattern of the gate insulation layer of the thin film transistor.

At least a portion of the gate line is disposed within the concave portion, thereby reducing the step difference of the at least a portion of the gate line. In an embodiment, the gate line is all located in the concave portion, and an upper surface of the gate line is flush with an opening of the concave portion; however, in an embodiment, since a height of the gate line is greater than a height of the first insulation layer 20, it is also possible that a portion of the gate line protrudes out of the concave portion.

A person skilled in the art can also perform patterning process twice using two masks to successively form the pattern of the gate line and the pattern of the gate electrode 73. Alternatively, the gate insulation layer can also cover the entire substrate 10 (of course the gate insulation layer is in the concave portion), in this case, the patterning process is not required.

At step 5, a conducting process is performed on the exposed active region 74 using any one of $NH_3$, $N_2$, and $H_2$ to reduce the resistance in ohmic contact between the active region 74 and the drain electrode 71 or the source electrode 72.

At step 6, a material of a second insulation layer 40 (specifically, an interlayer insulation layer, IDL) is deposited through a plasma enhanced chemical vapor deposition (PECVD) process. A dry-etching process is performed on the second insulation layer 40 to form a via-hole for coupling the drain electrode 71 to the active region 74 and a via-hole for coupling the source electrode 72 to the active region 74, and at the same time to form a via-hole for coupling the source electrode 72 to the metal light-shielding layer 60. The second insulation layer 40 is a single layer containing SiNx or SiOx or multiple layers in which SiNx and SiOx are stacked.

At step 7, a metal material for forming the drain electrode 71 and the source electrode 72 is deposited through a sputtering process. The optional metal material includes Al, Mo, Cr, Cu, or Ti, etc. with a thickness in a range of 200 nm-1000 nm. The photolithography process and the wet-etching process are performed on the metal material to form a pattern of the drain electrode 71, a pattern of the source electrode 72, and a pattern of the second signal line 32 (specifically, a data line).

It should be noted that since the first signal line 31 is disposed in the concave portion, a portion of the second signal line 32 overlapping with the first signal line 31 is also has a flat surface.

At step 8, a material for forming the passivation layer 80 is deposited through a PECVD process. The passivation layer 80 is formed by stacking one or more of SiNx, SiOx and SIOxNy. The passivation layer 80 has a thickness in a range of 100 nm-500 nm. The patterning processes such as the exposure process and the dry-etching process are performed on the passivation layer 80 to form a via-hole exploiting the source electrode 72.

At step 9, a material for forming the anode 90 is deposited through a sputtering process. The material for forming the anode 90 has a thickness in a range of 200 nm-1000 nm. The patterning processes such as the exposure process and the dry-etching process are performed on the material to form a pattern of the anode 90.

The steps for forming other structures such as an organic light-emitting layer, a cathode, and the like may also be included in the subsequent steps, but are omitted herein.

It should be noted that the materials, thicknesses, and the like of the structures in the above steps are merely examples and are not intended to limit the present disclosure.

FIG. 1 shows only one thin film transistor, a portion of the first signal line 31 (the gate line), and a portion of the second signal line 32 (the data line) in one sub-pixel of the display substrate. The remaining components of the display substrate can be conventionally designed and are not shown herein.

A display device including the display substrate according to the above embodiments is provided in an embodiment.

For example, the display device may be any display product or component with display function such as a liquid crystal display panel, an organic light emitting diode (OLED) display panel, an electronic paper, a mobile phone, a tablet computer, a television, a displayer, a notebook computer, a digital photo frame, a navigation device, and the like.

It should be understood that the above embodiments are merely exemplary embodiments for the purpose of illustrating the principles of the present disclosure, however, the present disclosure is not limited thereto. It will be apparent to those skilled in the art that various changes and modifications can be made without departing from the essence and spirit of the present disclosure, which are also to be regarded as falling within the scope of the present disclosure.

What is claimed is:

1. A display substrate, comprising:
   a substrate;
   a first insulation layer on the substrate;
   a first signal line on a side of the first insulation layer distal to the substrate;
   a second insulation layer, covering the first signal line;
   a second signal line on a side of the second insulation layer distal to the substrate, the second signal line overlapping with the first signal line at an overlap region;
   a metal light-shielding layer on a side of the substrate proximal to the first insulation layer and covered by the first insulation layer; and
   a thin film transistor on the side of the first insulation layer distal to the substrate,
   wherein
   a concave portion is formed in the first insulation layer, at least at the overlap region, the first signal line is in the concave portion, and
   an orthographic projection of the thin film transistor on the metal light-shielding layer is inside the metal light-shielding layer.

2. The display substrate according to claim 1, wherein an extension direction of the first signal line intersects with an extension direction of the second signal line.

3. The display substrate according to claim 2, wherein the concave portion has a hole shape; and
   a portion of the first signal line is in the hole-shaped concave portion in the overlap region.

4. The display substrate according to claim 2, wherein the concave portion is a long groove extending in parallel to a surface of the substrate; and
   the first signal line is in the long groove.

5. The display substrate according to claim 3, wherein a surface, which is distal to the side of the substrate, of the first signal line in the concave portion protrudes from the concave portion.

6. The display substrate according to claim 3, wherein a surface, which is distal to the side of the substrate, of the first signal line in the concave portion is flush with an opening of the concave portion.

7. The display substrate according to claim 3, wherein a surface, which is distal to the side of the substrate, of the first signal line in the concave portion is lower than an opening of the concave portion.

8. The display substrate according to claim 6, wherein the first insulation layer comprises silicon organic glass.

9. The display substrate according to claim 8, further comprising a third insulation layer between a bottom surface of the concave portion and the first signal line.

10. The display substrate according to claim 8, further comprising a third insulation layer covering the bottom surface and sidewalls of the concave portion and extending onto a surface of the first insulation layer distal to the substrate.

11. A display device, comprising the display substrate according to claim 1.

12. A method for manufacturing a display substrate, comprising:
    forming a first insulation layer on a substrate;
    forming a concave portion in the first insulation layer;

forming a first signal line on a side of the first insulation layer distal to the substrate;

forming a second insulation layer on the first signal line; and forming a second signal line on a side of the second insulation layer distal to the substrate, the second signal line overlapping with the first signal line at an overlap region, wherein at least at the overlap region, the first signal line is formed in the concave portion, and the forming a first insulation layer on the substrate and forming a concave portion in the first insulation layer comprises;

coating a solution of silicon organic glass on the substrate; and performing a pre-baking process, an exposure process, and a development process on the solution of silicon organic glass to obtain the concave portion.

13. The method according to claim 2, wherein an extension direction of the first signal line intersects with an extension direction of the second signal line;

the concave portion is formed in a hole shape; and a portion of the first signal line is formed in the concave portion in the overlap region.

14. The method according to claim 13, wherein the first signal line is formed such that a surface, which is distal to the side of the substrate, of the first signal line in the concave portion is flush with an opening of the concave portion.

15. The method according to claim 14, wherein between the forming a concave portion in the first insulation layer and the forming a second insulation layer, the method further comprises:

forming a third insulation layer covering the bottom surface and sidewalls of the concave portion and extending onto a surface of the first insulation layer distal to the substrate; and forming the first signal line on the third insulation layer in the concave portion.

16. The method according to claim 14, wherein between the forming a concave portion in the first insulation layer and the forming a second insulation layer, the method further comprises:

forming a third insulation layer on a bottom surface of the concave portion; and forming the first signal line on the third insulation layer.

17. The method according to claim 13, wherein the first signal line is formed such that a surface, which is distal to the side of the substrate, of the first signal line in the concave portion protrudes from the concave portion.

18. The method according to claim 12, wherein an extension direction of the first signal line intersects with an extension direction of the second signal line;

the concave portion is formed as a long groove extending in parallel to a surface of the substrate; and the first signal line is formed in the long groove.

\* \* \* \* \*